United States Patent
Narazaki

(10) Patent No.: US 8,618,604 B2
(45) Date of Patent: Dec. 31, 2013

(54) SEMICONDUCTOR DEVICE AND METHOD OF MANUFACTURING THE SAME

(75) Inventor: Atsushi Narazaki, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 312 days.

(21) Appl. No.: 12/848,411

(22) Filed: Aug. 2, 2010

(65) Prior Publication Data

US 2011/0089522 A1    Apr. 21, 2011

(30) Foreign Application Priority Data

Oct. 15, 2009    (JP) .................. 2009-238577

(51) Int. Cl.
*H01L 29/66*    (2006.01)
(52) U.S. Cl.
USPC .............. 257/331; 257/E29.13; 257/E29.201; 257/E29.624; 438/212; 438/587
(58) Field of Classification Search
USPC ............ 257/328, 329, 330, 331, 332, E29.13, 257/E29.201, E29.621, E29.624; 438/212, 438/258, 268, 270, 271, 587, 588, 589
See application file for complete search history.

(56) References Cited

U.S. PATENT DOCUMENTS

| | | | |
|---|---|---|---|
| 5,329,142 A * | 7/1994 | Kitagawa et al. | 257/139 |
| 6,232,231 B1 | 5/2001 | Sethuraman et al. | |
| 6,359,306 B1 | 3/2002 | Ninomiya | |
| 7,211,861 B2 * | 5/2007 | Teramae et al. | 257/330 |
| 7,790,549 B2 * | 9/2010 | Hebert | 438/268 |
| 2002/0119614 A1 | 8/2002 | Haraguchi et al. | |
| 2002/0120911 A1 | 8/2002 | Hino et al. | |
| 2002/0125474 A1 | 9/2002 | Hino et al. | |
| 2004/0124411 A1 | 7/2004 | Lee | |
| 2006/0065981 A1 | 3/2006 | Egusa | |
| 2009/0057927 A1 | 3/2009 | Choe | |
| 2010/0066440 A1 * | 3/2010 | Juengling | 327/537 |
| 2011/0031997 A1 * | 2/2011 | Or-Bach et al. | 326/37 |
| 2012/0225387 A1 * | 9/2012 | Yamamoto | 430/319 |

FOREIGN PATENT DOCUMENTS

| | | |
|---|---|---|
| CN | 1373515 A | 10/2002 |
| CN | 101383324 A | 3/2009 |
| JP | 5-217834 | 8/1993 |
| JP | 6-5686 | 1/1994 |
| JP | 6-20903 A | 1/1994 |

(Continued)

OTHER PUBLICATIONS

Richard C. Jaeger, Introduction to Microelectronic Fabrication, 2002, Prentice Hall, 2nd Ed., pp. 2 and 3.*

(Continued)

*Primary Examiner* — Eduardo A Rodela
(74) *Attorney, Agent, or Firm* — Oblon, Spivak, McClelland, Maier & Neustadt, L.L.P.

(57) ABSTRACT

A semiconductor wafer has a main surface. A main chip region is formed on the main surface. A sub-chip region is smaller in area than the main chip region, and positioned on an edge side of the semiconductor wafer relative to the main chip region. The sub-chip region is identical to the main chip region in design pattern. Accordingly, a semiconductor device in which occurrence of a pattern failure at the edge of the wafer can be prevented when chips are arranged in the surface of the semiconductor wafer and a method of manufacturing the same can be obtained.

14 Claims, 11 Drawing Sheets

(56) References Cited

FOREIGN PATENT DOCUMENTS

| | | |
|---|---|---|
| JP | 63-62229 | 3/1998 |
| JP | 2000-021882 | 1/2000 |
| JP | 2001-235851 | 8/2001 |
| JP | 2003-264227 | 9/2003 |
| JP | 2004-356386 | 12/2004 |
| JP | 2005-347760 | 12/2005 |
| KR | 10-1996-0002587 | 1/1996 |
| KR | 10-2004-0057789 | 7/2004 |
| KR | 10-0801745 B1 | 2/2008 |
| KR | 10-2008-0029493 A | 4/2008 |

OTHER PUBLICATIONS

Korean Office Action issued Oct. 21, 2011, in Patent Application No. 10-2010-0097145 (with English-language translation).

Combined Chinese Office Action and Search Report issued Aug. 31, 2012, in Chinese Patent Application No. 201010511008.6 with English translation.

Office Action issued Feb. 16, 2013 in Chinese Patent Application No. 201010511008.6 (with English translation).

Office Action issued on Apr. 19, 2013 in related German Application No. 10 2010 042 383.1 with its English translation.

Office Action issued on May 28, 2013 in related Japanese Application No. 2009-238577 with its English translation.

\* cited by examiner

SEMICONDUCTOR DEVICE AND METHOD OF MANUFACTURING THE SAME

BACKGROUND OF THE INVENTION

1. Field of the Invention

The present invention relates to a semiconductor device and a method of manufacturing the same, and more particularly to a semiconductor device having chips arranged in a surface of a semiconductor wafer and a method of manufacturing the same.

2. Description of the Background Art

There is a technical trend toward miniaturization of a pattern for higher density of transistor cells in a semiconductor device for the purpose of improving performance. Pattern miniaturization techniques not only improve chip performance, but also have the effect of reducing cost owing to reduction in chip size. Semiconductor chips are arranged in matrix form on a silicon wafer, and subjected to several wafer manufacturing steps such as deposition, diffusion, transfer, and processing, to be manufactured as a product.

In recent years, with miniaturization of design rule, a transfer device mainly uses a stepper of performing exposure for each shot in a step and repeat process. A stepper can use a mask pattern having a size five times the size of a pattern to be transferred onto a wafer. Accordingly, a stepper has the advantage of being able to transfer a finer pattern than in a conventional mirror projection system of performing exposure so that a transfer pattern and a mask pattern have the same size.

In etching process, etching solutions vary depending on a material for a film to be etched and the like. When a silicon oxide film is etched, for example, etching is performed with a hydrofluoric acid-based solution through the use of a resist pattern having been formed in a transfer step as a mask. In this method, reaction with the etching solution proceeds in a vertical direction as well as a horizontal direction of a pattern, resulting in an etched bowl shape. This etching, which proceeds in a vertical direction and a horizontal direction, is called isotropic etching. With miniaturization in recent years, this etching has been replaced with dry etching in which etching is performed under vacuum with a Freon type gas. Dry etching, by which an etching pattern having substantially the same horizontal size as that of a resist pattern is obtained, is called anisotropic etching.

Dry etching is commonly employed for a miniaturized pattern in order to improve stability of a finished dimension. In anisotropic dry etching, a thin material layer (sidewall protection film) is formed on sidewall surfaces during etching to block etching in a horizontal direction, so that a substantially vertical opening shape can be obtained.

This sidewall protection film is a polymerized film formed in plasma, or a silicon oxide film generated from a material to be etched during silicon etching. When a mask having a fine opening pattern is arranged on a wafer to perform silicon etching, for example, nonuniform arrangement of the opening pattern on the wafer results in lower supply of a silicon oxide film as the sidewall protection film. Particularly when a blank region where chips are not arranged (region not to be etched) is provided at an edge of a wafer, supply of a silicon oxide film (sidewall protection film) during silicon etching becomes lower in the vicinity of the blank region. As a result, the sidewall protection film is decreased and a pattern formation failure such as an overhang is likely to occur. By way of example, Japanese Patent Laying-Open No. 2003-264227 discloses formation of such sidewall protection film and trench shapes that vary due to a nonuniform aperture ratio of an opening pattern.

In order to eliminate the nonuniformity of an aperture ratio, in a process requiring a fine pattern, the blank region is not formed but an opening pattern is arranged on the entire surface of a wafer.

An end portion (edge portion) of a silicon wafer is uneven, like an intermediate portion thereof, and is beveled with approximately 10 to 20 degrees in order to prevent wafer chipping. Accordingly, when a pattern is formed on the entire surface of the wafer, the pattern is also formed on the beveled region.

Since a beveled region has an unstable shape and an unstable thickness of an applied photoresist, patterning in a transfer step is performed in an unstable state in the vicinity of the beveled region. If the process varies in this state, a pattern resolution failure and a foreign object due to a resist residue occur.

In order to prevent such pattern failure at a wafer edge portion, an edge rinse method in which an organic solvent is delivered to a wafer edge portion after application of a resist to remove the resist in the edge (e.g., 3 mm) region, a peripheral exposure method in which only a wafer edge portion is exposed after application of a resist to similarly remove the resist in the edge region, or the like is employed.

With these methods, however, a miniaturized pattern size causes an edge of a pattern to be uneven (e.g., inclined) to generate thinner regions. Consequently, the pattern itself collapses, resulting in occurrence of a foreign object.

With a miniaturized pattern, therefore, it has been impossible to simultaneously prevent all of a pattern formation failure due to shortage of a sidewall protection film at a wafer edge portion, a pattern resolution failure due to uneven thickness of an applied resist, and occurrence of a foreign object due to pattern collapse.

SUMMARY OF THE INVENTION

The present invention was made in view of the problems described above, and an object of the present invention is to provide a semiconductor device in which a pattern failure at an edge of a semiconductor wafer can be prevented when chips are arranged in a surface of the wafer, and a method of manufacturing the same.

A semiconductor device according to the present invention includes a semiconductor wafer, a first chip region, and a second chip region. The semiconductor wafer has a main surface. The first chip region is formed in the main surface, and has a first pattern. The second chip region is smaller in area than the first chip region, arranged adjacent to the first chip region in the main surface, and has a second pattern. The second pattern is formed in an identical design pattern to the first pattern.

A method of manufacturing a semiconductor device according to the present invention includes the following steps.

First, a photosensitive material is formed on a main surface of a semiconductor wafer. A first chip formation region of the photosensitive material is exposed to light of a first pattern. A second chip formation region of the photosensitive material adjacent to and smaller than the first chip formation region is exposed to light of a second pattern being formed in an identical design pattern to the first pattern. The photosensitive material having been exposed to lights of the first and second patterns is developed to pattern the photosensitive material. A portion to be etched of the semiconductor wafer are selectively removed by etching with the patterned photosensitive material as a mask, to transfer the first pattern to a first chip region corresponding to the first chip formation region in the portion to be etched, and transfer the second pattern to a second chip region corresponding to the second chip formation region in the portion to be etched.

According to the present invention, the second chip region smaller in area than the first chip region is formed adjacent to the first chip region, and the second chip region is identical to the first chip region in design pattern. Therefore, occurrence of a failure of the first pattern in the first chip region can be prevented.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described below with reference to the drawings.

(First Embodiment)

First, a structure of a semiconductor device according to the present embodiment is described with reference to FIGS. 1 to 6.

Figure 1:
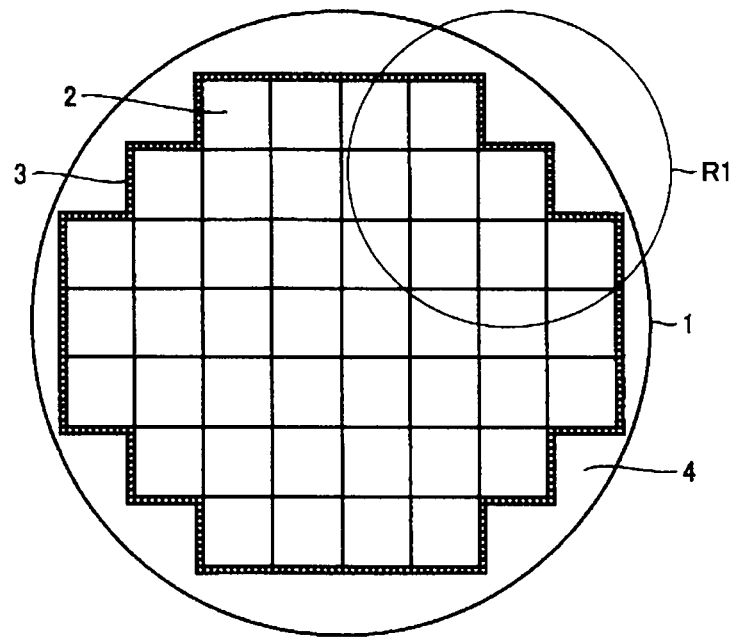
FIG. 1 is a plan view schematically showing a structure of a semiconductor device according to a first embodiment of the present invention.
Figure 2:
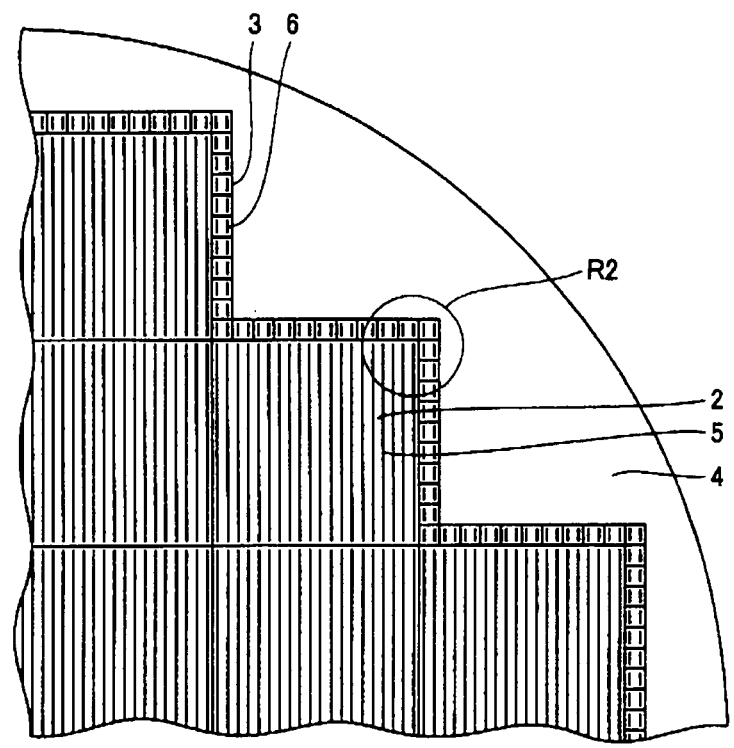
FIG. 2 is an enlarged plan view showing an enlarged region R1 in FIG. 1.
Figure 3:
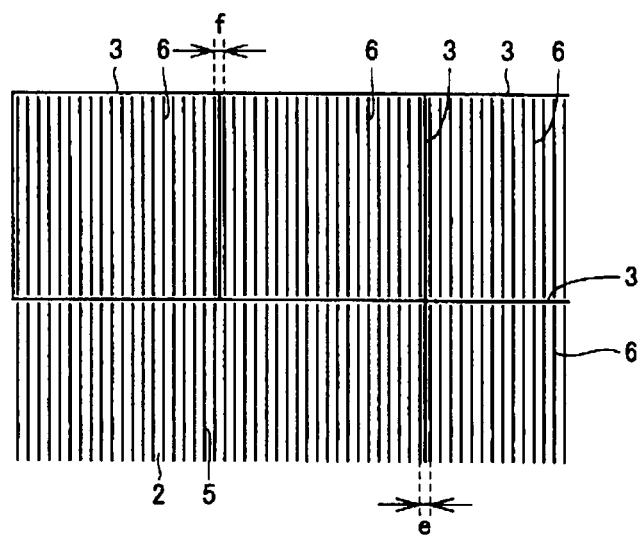
FIG. 3 is an enlarged plan view showing an enlarged region R2 in FIG. 2.

Referring to FIGS. 1 to 3, the semiconductor device according to the present embodiment is a semiconductor wafer 1 having a silicon substrate, for example. Semiconductor wafer 1 mainly includes a plurality of main chip regions (first chip regions) 2, a plurality of sub-chip regions (second chip regions) 3, and a blank region 4.

The plurality of main chip regions 2 are arranged in matrix form in a main surface of semiconductor wafer 1. The plurality of sub-chip regions 3 are arranged, when viewed two-dimensionally, to surround the periphery of a region where the plurality of main chip regions 2 are arranged. Blank region 4 is arranged in an outer region on the main surface of semiconductor wafer 1 relative to sub-chip regions 3. Neither main chip regions 2 nor sub-chip regions 3 reach a circumferential edge of semiconductor wafer 1, and blank region 4 is interposed between all of sub-chip regions 3 and the circumferential edge of semiconductor wafer 1.

Each of the plurality of main chip regions 2 has a rectangular shape, for example, when viewed two-dimensionally. A first pattern 5 is formed in each of the plurality of main chip regions 2. First pattern 5 is a stripe pattern (pattern in stripes), for example. The stripe pattern may be a pattern in which a plurality of convex pattern portions (e.g., linear convex pattern portions) run parallel to one another, or a pattern in which a plurality of concave pattern portions (e.g., linear concave pattern portions) run parallel to one another.

Each of the plurality of sub-chip regions 3 has a rectangular shape, for example, when viewed two-dimensionally, and is smaller in area than each of main chip regions 2 when viewed two-dimensionally. Sub-chip region 3 is preferably similar to main chip region 2 in plane shape. A second pattern 6 is formed in each of the plurality of sub-chip region 3. Second pattern 6 is a stripe pattern, for example. The stripe pattern may be a pattern in which a plurality of convex pattern portions run parallel to one another, or a pattern in which a plurality of concave pattern portions run parallel to one another, as in main chip region 2.

First pattern 5 is formed in an identical design pattern to second pattern 6. The identical design pattern herein means that first pattern 5 in main chip region 2 and second pattern 6 in sub-chip region 3 are formed with identical density when viewed two-dimensionally, and that second pattern 6 is arranged to keep regularity of first pattern 5.

Figure 4A:
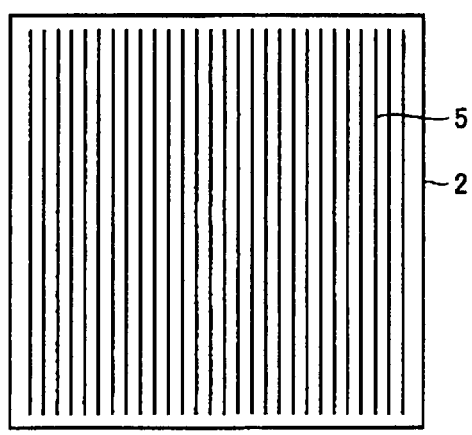
FIG. 4A is a partial plan view showing an enlarged main chip region in the structure of FIG. 1.
Figure 4B:
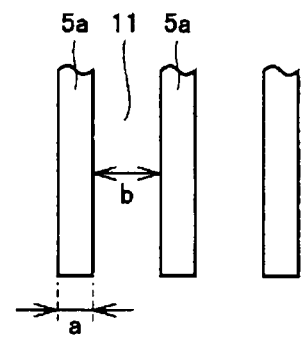
FIG. 4B is a partially enlarged plan view showing a width a of a pattern portion and an interval b between the pattern portions forming a first pattern in the main chip region.
Figure 5A:
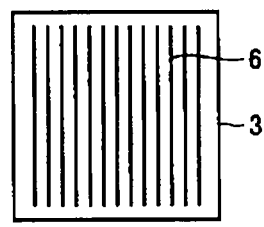
FIG. 5A is a partial plan view showing an enlarged sub-chip region in the structure of FIG. 1.
Figure 5B:
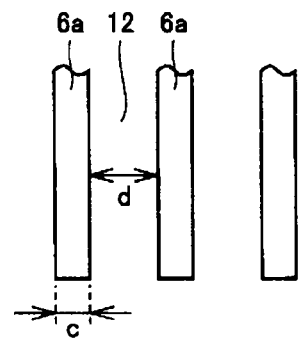
FIG. 5B is a partially enlarged plan view showing a width c of a pattern portion and an interval d between the pattern portions forming a second pattern in the sub-chip region.

Specifically, a width a of each pattern portion 5a and an interval b between pattern portions 5a forming the stripe pattern as first pattern 5 as shown in FIGS. 4A and 4B should be equal to a width c of each pattern portion 6a and an interval d between pattern portions 6a forming the stripe pattern as second pattern 6 as shown in FIGS. 5A and 5B, respectively (i.e., a=c, b=d). First pattern 5 need not be identical to second pattern 6 in length.

As shown in FIG. 3, each pattern portion forming the stripe pattern as second pattern 6 in sub-chip region 3 arranged in a direction in which first pattern 5 in main chip region 2 extends (longitudinal direction: vertical direction in the figure) is preferably positioned in the same line as each pattern portion forming the stripe pattern as first pattern 5. In addition, each pattern portion forming the stripe pattern as second pattern 6 in sub-chip region 3 arranged in a direction in which each pattern portion forming the stripe pattern as first pattern 5 in main chip region 2 extends (lateral direction: horizontal direction in the figure) is preferably arranged parallel to each pattern portion forming the stripe pattern as first pattern 5.

Moreover, an interval e between a pattern portion of first pattern 5 in main chip region 2, which is arranged closest to sub-chip region 3, and a pattern portion of second pattern 6 in sub-chip region 3 arranged adjacent to the above main chip region 2 in the figure, which is arranged closest to main chip region 2, is preferably equal to intervals b and d described above.

Furthermore, an interval f between pattern portions of second patterns 6 in sub-chip regions 3 adjacent to each other, which are arranged closest to each other, is also preferably equal to intervals b and d described above.

Blank region 4 is a region where patterns are not arranged (formed).

Figure 6:
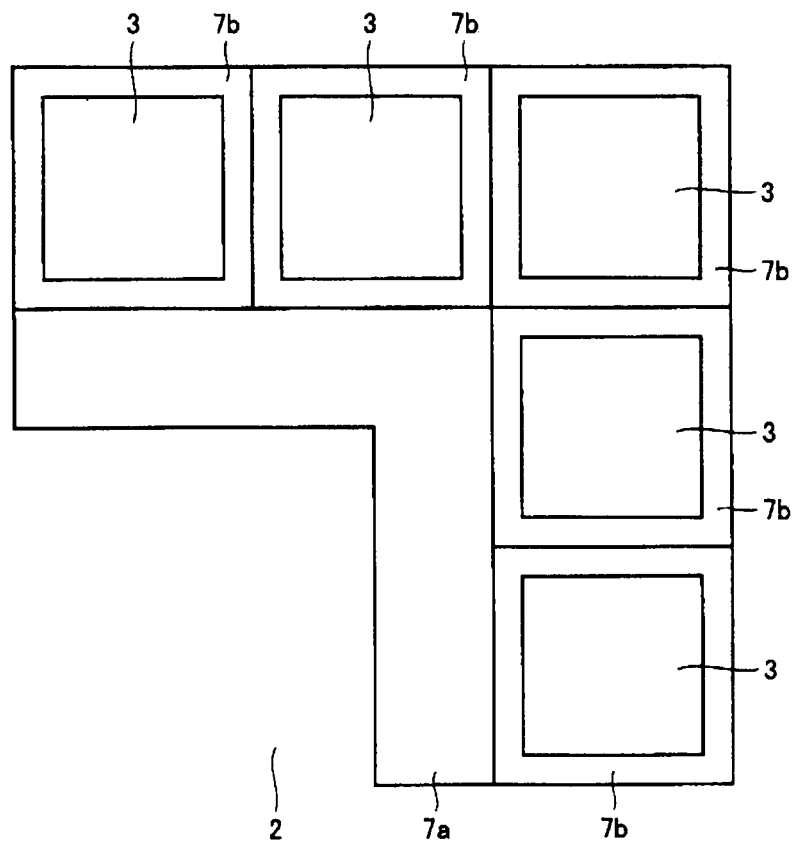
FIG. 6 is an enlarged plan view showing an exaggerated structure of a dicing line region in the structure of FIG. 1.

Referring to FIG. 6, main chip region 2 can be distinguished (differentiated) from sub-chip regions 3, and sub-chip regions 3 can be distinguished (differentiated) from one another, by dicing line regions 7a and 7b, respectively. Dicing line region 7a is provided to surround the periphery of main chip region 2 when viewed two-dimensionally, and dicing line region 7b is provided to surround the periphery of sub-chip region 3 when viewed two-dimensionally. Each of dicing line regions 7a and 7b does not include a functional element or the like.

Although dicing line regions 7a and 7b are inherently much smaller than chip regions 2 and 3, dicing lines 7a and 7b are shown in an enlarged state in FIG. 6 for clarification.

Next, a method of manufacturing the semiconductor device according to the present embodiment is described with reference to FIGS. 18 to 23.

Figure 18:
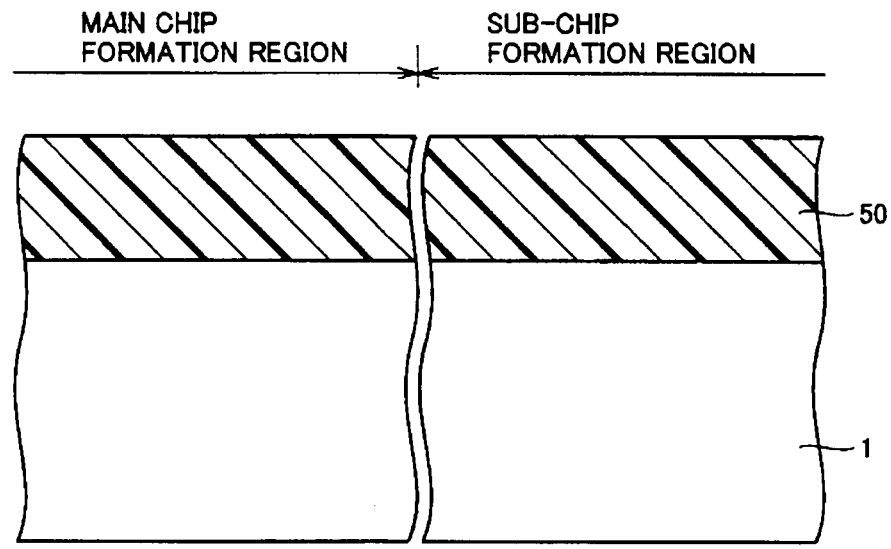
FIGS. 18 to 23 are schematic cross-sectional views successively showing a method of manufacturing the semiconductor device according to the first embodiment of the present invention.

Referring to FIG. 18, in the method of manufacturing the semiconductor device according to the present embodiment, semiconductor wafer 1 made of silicon, for example, is prepared. A photosensitive material (e.g., photoresist) 50 is applied to and formed on the entire surface of semiconductor wafer 1.

Figure 19:
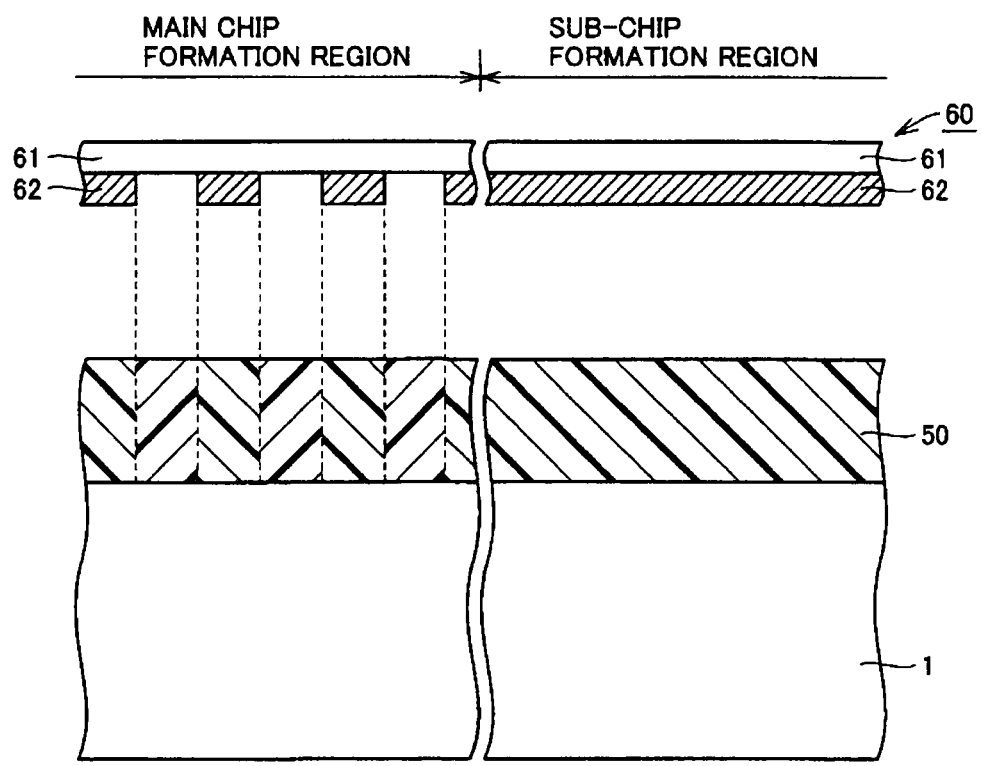

Referring to FIG. 19, a first exposure process is performed with a photomask 60 for main chips on a main chip formation region of photosensitive material 50, to expose photosensitive material 50 to light of a first pattern. Photomask 60 includes a transparent substrate 61 and a light-shielding film 62 formed thereon, for example.

Figure 20:
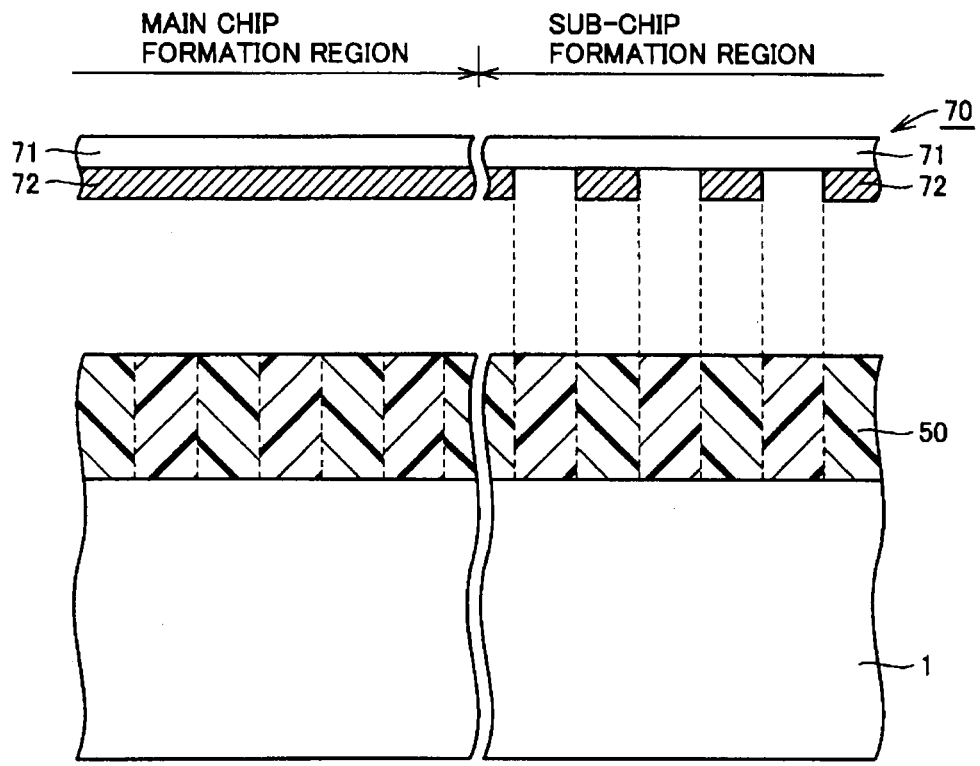

Referring to FIG. 20, a second exposure process is performed with a photomask 70 for sub-chips on a sub-chip formation region of photosensitive material 50, to expose photosensitive material 50 to light of a second pattern. Photomask 70 includes a transparent substrate 71 and a light-shielding film 72 formed thereon, for example.

The exposure is performed such that the sub-chip formation region is smaller in area than the main chip formation region when viewed two-dimensionally and is adjacent to the main chip formation region. The exposure is also performed such that the second pattern in the sub-chip formation region is formed in an identical design pattern to the first pattern in the main chip formation region.

Figure 21:
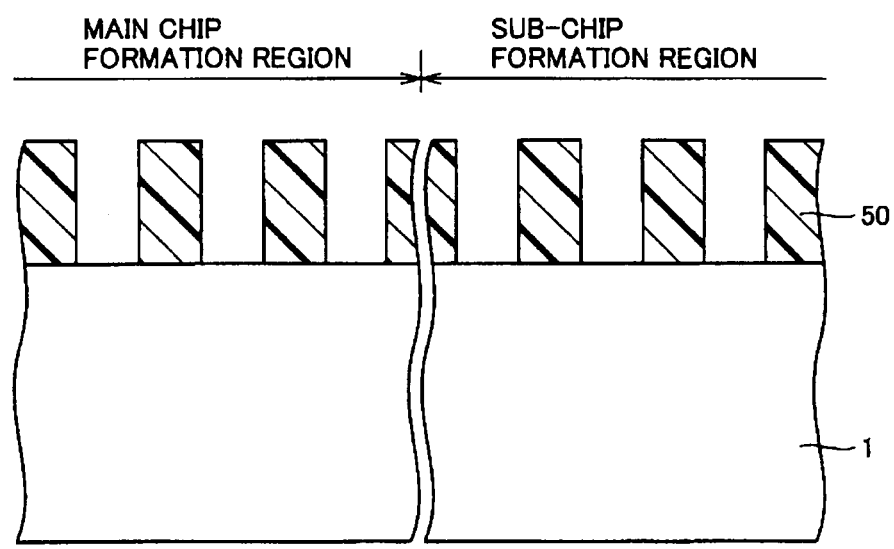

Referring to FIG. 21, a development process is performed on exposed photosensitive material 50, to pattern photosensitive material 50. With patterned photosensitive material 50 as a mask, portions to be etched of semiconductor wafer 1 are selectively removed by etching.

Figure 22:
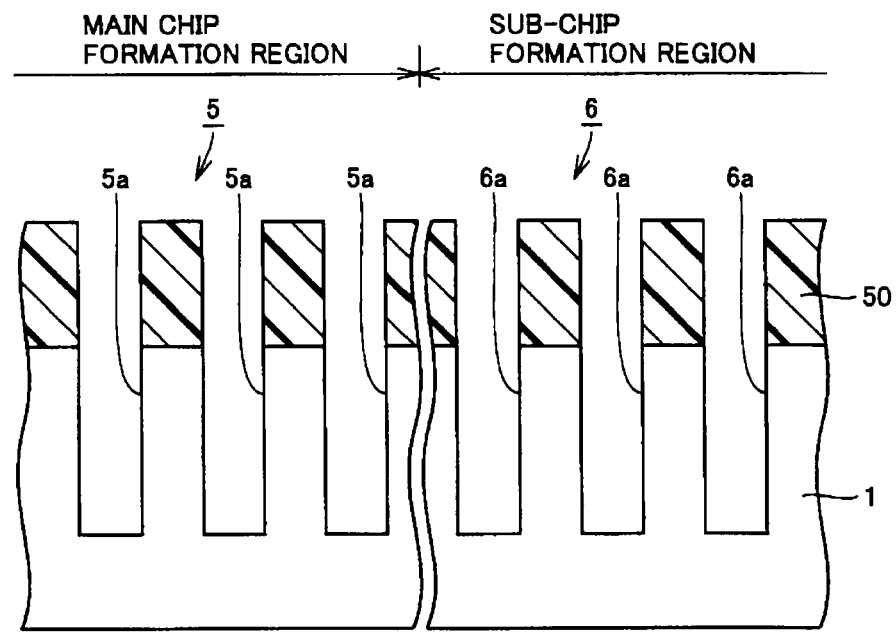

Referring to FIG. 22, as a result of the etching described above, first pattern 5 is transferred to the main chip region (first chip region) corresponding to the main chip formation region in the portions to be etched, and second pattern 6 is transferred to the sub-chip region (second chip region) corresponding to the sub-chip formation region in the portions to be etched. First pattern 5 has a plurality of grooves 5a and a plurality of mesa regions, for example, and is a stripe pattern in which grooves 5a and the mesa regions are alternately arranged. Second pattern 6 has a plurality of grooves 6a and a plurality of mesa regions, for example, and is a stripe pattern in which grooves 6a and the mesa regions are alternately arranged. Thereafter, photosensitive material 50 is removed.

Figure 23:
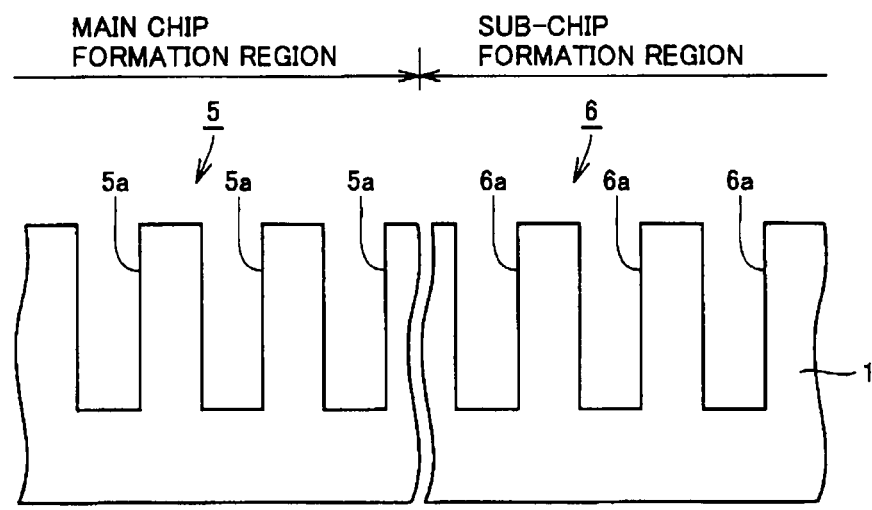

Referring to FIG. 23, with the manufacturing method described above, first and second patterns 5 and 6 can be simultaneously formed in main chip region 2 and sub-chip region 3 of semiconductor wafer 1.

Next, a function and effect of the present embodiment is described in comparison to a comparative example.

Figure 7:
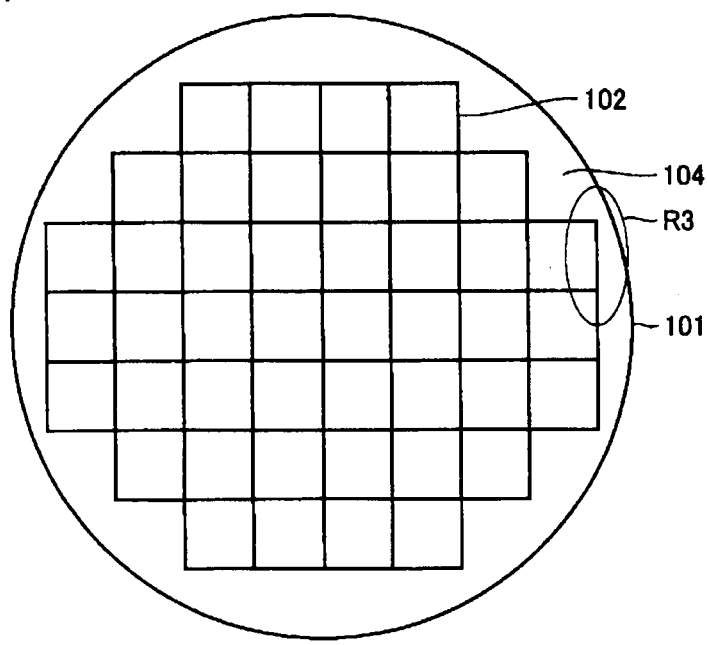
FIG. 7 is a plan view schematically showing a structure of a semiconductor device in a comparative example.
Figure 8:
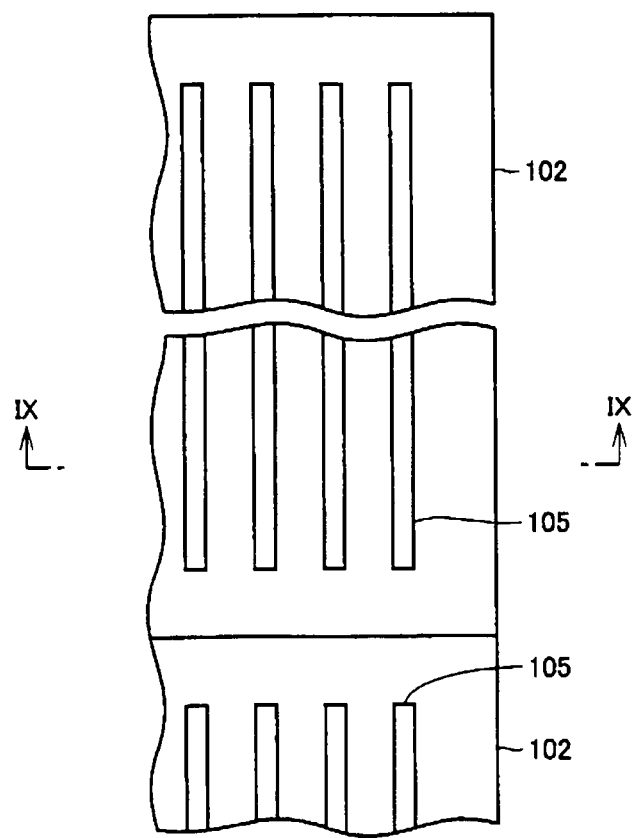
FIG. 8 is an enlarged plan view showing an enlarged region R3 in FIG. 7.

Referring to FIG. 7, first, as a comparative example, a structure having a plurality of chip regions 102 arranged in a main surface of a silicon wafer 101 and a blank region 104 arranged on an outer side relative to chip regions 102, and not having sub-chip regions is considered. In this comparative example, as shown in FIG. 8, a plurality of opening pattern portions (e.g., trench pattern portions) 105 are arranged at regular intervals in each of chip regions 102.

In this comparative example, since blank region 104 is a region without a pattern, silicon wafer 101 is not etched in blank region 104. Thus, as shown in a cross-sectional view of FIG. 9, supply of a silicon oxide film becomes lower when an outermost trench 105b in silicon wafer 101 is formed by etching. Accordingly, a sidewall protection film is hard to form on a sidewall of outermost trench 105b, resulting in reduction in etching rate in outermost trench 105b as compared to in an inner trench 105a, so that a pattern formation failure such as an overhang shape is likely to occur.

Figure 9:
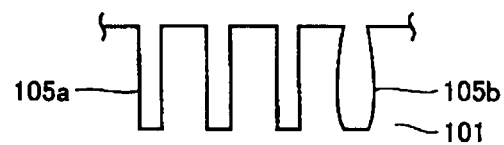
FIG. 9 is a schematic cross-sectional view showing a cross section of a portion along the line IX-IX in FIG. 8.

If outermost trench 105b has an etched shape such as an overhang as shown in FIG. 9, variations in trench depth occur in the surface of wafer 101. As a result, when gate electrodes are formed in those trenches, for example, variations in transistor performance occur. When those trenches function as a contact pattern, a bonding failure occurs.

Figure 10:
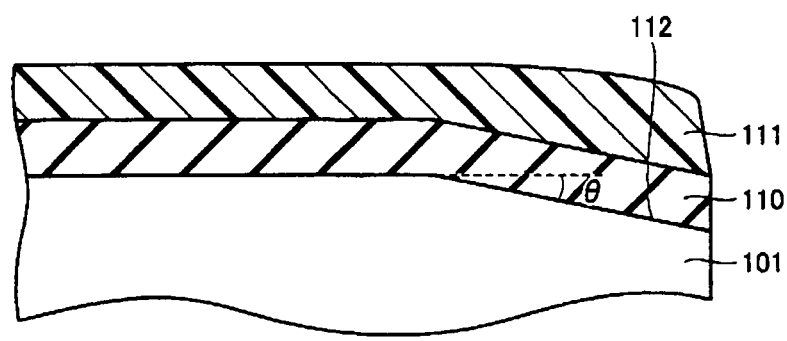
FIG. 10 is a partially enlarged cross-sectional view showing enlarged film to be etched and photoresist which have been formed on a beveled portion at an end of a semiconductor wafer.

Referring to FIG. 10, silicon wafer 101 commonly has a beveled region 112 with an angle θ of 10 to 20 degrees at its end portion. A photoresist 111 formed by spin coating on the main surface of silicon wafer 101 is thicker in beveled region 112 than in other regions. When a fine pattern is transferred to such end portion of wafer 101, a resolution failure occurs in the pattern due to a focus margin of thick photoresist 111.

Figure 11:
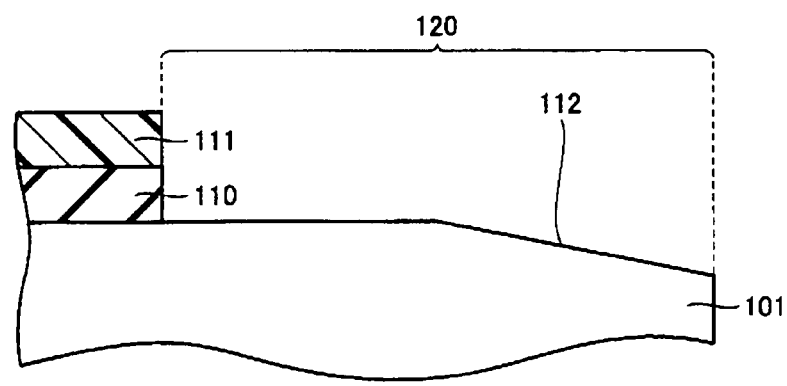
FIG. 11 is a partially enlarged cross-sectional view showing an enlarged state after the film to be etched and photoresist on the beveled portion at the end of the semiconductor wafer were patterned and removed.

In order to prevent the pattern resolution failure, photoresist 111 and oxide film 110 at the edge of wafer 101 are removed to expose the main surface of base silicon wafer 101 by peripheral exposure and a development process, or by an edge rinse process after application of the resist, as shown in FIG. 11.

Figure 12:
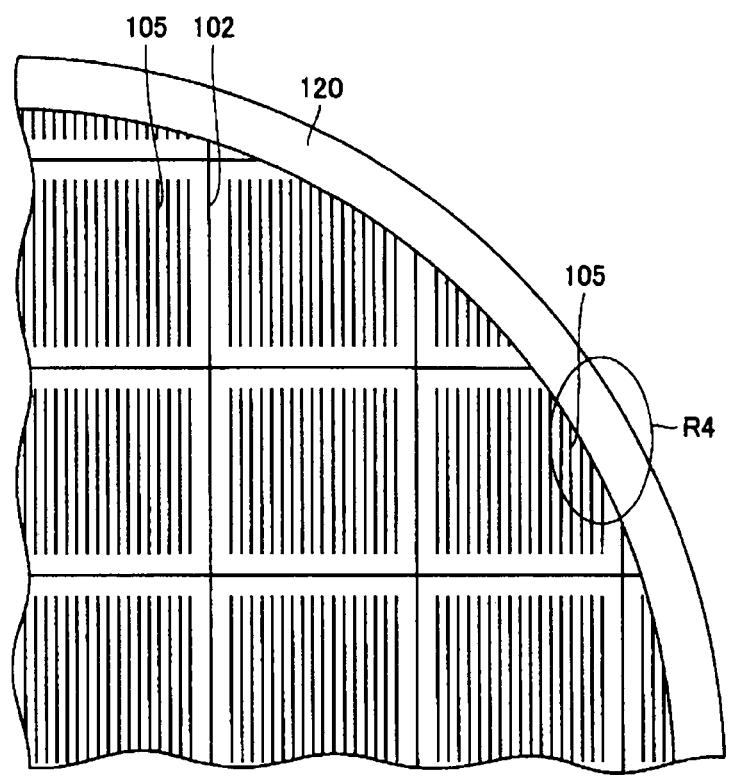
FIG. 12 is a plan view of FIG. 11 viewed from above, and is a schematic plan view showing an upper right quarter of a region of the semiconductor wafer.
Figure 13:
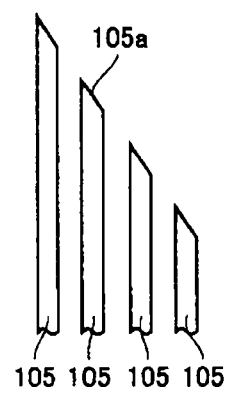
FIG. 13 is an enlarged plan view showing an enlarged stripe pattern in a region R4 in FIG. 12.

With this method, however, as shown in FIGS. 12 and 13, a tip 105a of pattern portion 105 reaching a wafer outer region 120 where silicon is exposed in a ring shape among fine pattern portions 105 formed in chip region 102 has an acute shape. Accordingly, if pattern portion 105 having acute tip 105a is a maintained pattern of silicon or an oxide film, pattern portion 105 is likely to collapse due to insufficient strength (i.e., pattern collapse is likely to occur). Then, the collapsed pattern portion adheres to another portion as a foreign object, resulting in a lower yield.

In contrast, in the present embodiment, sub-chip regions 3 identical to main chip regions 2 in design pattern are arranged around main chip regions 2 as described above. Accordingly, supply of a sidewall protection film to first pattern 5 in main chip region 2 is increased during silicon etching, and loading effect is suppressed. Therefore, occurrence of a pattern shape failure can be prevented, and an etched shape with high accuracy can be obtained.

Furthermore, by making sub-chip region 3 smaller than main chip region 2 in size, blank region 4 can be ensured at the entire edge of the wafer. Therefore, occurrence of a pattern resolution failure and pattern collapse caused by a thick photoresist formed at the beveled portion of the wafer can also be prevented.

(Second Embodiment)

Referring to FIGS. 1 to 3, if the second pattern identical to the first pattern in main chip region 2 in design pattern is formed in sub-chip region 3, sub-chip region 3 may include a functional element such as a transistor.

By including such functional element, sub-chip region 3 may also function as an active chip.

Sub-chip region 3 made as an active chip can further function as a transistor having a current rating reduced from that of main chip region 2, or as a monitor chip for property evaluation. Additionally, a functional element chip having a small area can be formed by utilizing the blank region of semiconductor wafer 1.

(Third Embodiment)

Figure 14:
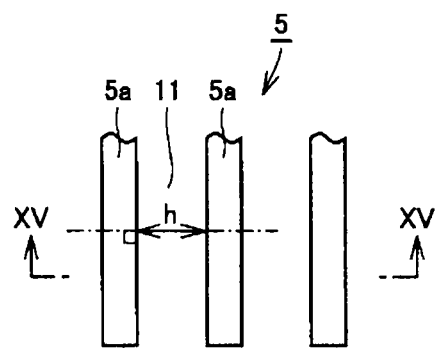
FIG. 14 is a partially enlarged plan view partially showing a structure of the first pattern in the structure in FIG. 1.
Figure 15:
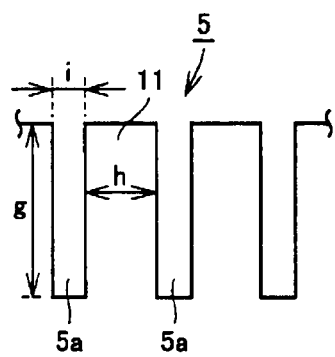
FIG. 15 is a schematic cross-sectional view showing a cross section of a portion along the line XV-XV in FIG. 14.

Referring to FIGS. 14 and 15, first pattern 5 is a stripe pattern in which a removed (concave) pattern portion (groove) 5a and a maintained (convex) pattern portion (mesa region) 11 are alternately repeated, for example. A width h of mesa region 11 (dimension h in a direction orthogonal to the stripe pattern) is preferably not more than 1.5 μm.

According to the present embodiment, since pattern collapse can be prevented by providing sub-chip region 3 as in the first embodiment, width h of mesa region 11 can be made as small as not more than 1.5 μm. Therefore, the present embodiment is particularly effective for a fine pattern.

(Fourth Embodiment)

Referring to FIGS. 14 and 15, first pattern 5 is a stripe pattern in which removed (concave) pattern portion (groove) 5a and maintained (convex) pattern portion (mesa region) 11 are alternately repeated, for example. When a dimension and a depth of an opening of groove 5a are represented as i and g, respectively, an aspect ratio (g/i) of groove 5a is preferably not less than 6.

According to the present embodiment, since pattern collapse can be prevented by providing sub-chip region 3 as in the first embodiment, the aspect ratio (g/i) of groove 5a can be set not less than 6. Therefore, the present embodiment is particularly effective for a fine pattern.

(Fifth Embodiment)

The stripe pattern as first pattern 5 formed in main chip region 2 may be used for a trench gate structure of a power semiconductor element. Such structure is described below with reference to FIG. 16.

Figure 16:
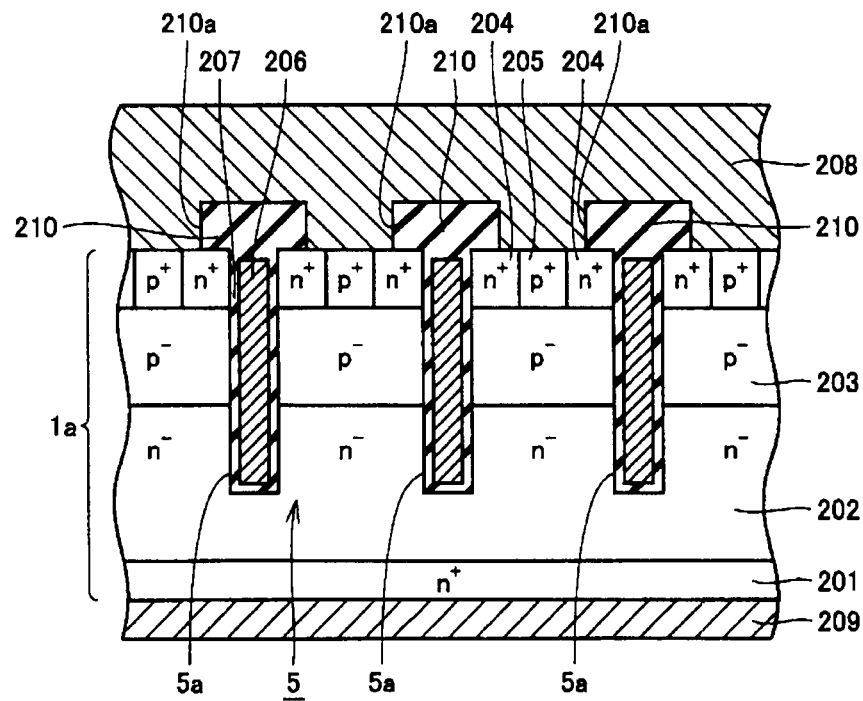
FIG. 16 is a cross-sectional view schematically showing a structure of a MOSFET (Metal Oxide Semiconductor Field Effect Transistor) serving as a power semiconductor element having a trench gate structure formed in a first chip region.

Referring to FIG. 16, a vertical MOSFET is described by way of example as a power semiconductor element in the present embodiment. The vertical MOSFET is formed in a semiconductor substrate $1a$, and mainly includes an $n^+$ drain region 201, an $n^-$ drift region 202, a $p^-$ body region 203, an $n^+$ source region 204, a gate insulating film 207, and a gate electrode layer 206.

Semiconductor substrate $1a$ includes a first main surface (upper surface in the figure) and a second main surface (lower surface in the figure) facing each other. $N^+$ drain region 201 is formed on the second main surface of semiconductor substrate $1a$. $N^-$ drift region 202 and $p^-$ body region 203 are successively formed on $n^+$ drain region 201. On the first main surface side of $p^-$ body region 203, $n^+$ source region 204 and a $p^+$ contact region 205 are formed adjacent to each other.

In the first main surface of semiconductor substrate $1a$, the plurality of grooves $5a$ penetrating $n^+$ source region 204 and $p^-$ body region 203 to reach $n^-$ drift region 202 are formed. These grooves (concave pattern portions) $5a$ and mesa regions (convex pattern portions) adjacent to grooves $5a$ form first pattern 5. First pattern 5 is a stripe pattern in which groove $5a$ and the mesa region adjacent to groove $5a$ are alternately arranged.

Gate insulating film (e.g., silicon oxide film) 207 is formed along a wall surface of groove $5a$, and groove $5a$ is filled with gate electrode layer 206. Thus, gate electrode layer 206 is positioned to face $p^-$ body region 203 with gate insulating film 207 interposed therebetween.

On the second main surface of semiconductor substrate $1a$, a drain electrode 209 is formed to be electrically connected to $n^+$ drain region 201. On the first main surface of semiconductor substrate $1a$, a source electrode 208 is formed to be electrically connected to both of $n^+$ source region 204 and $p^+$ contact region 205, and to be electrically isolated from gate electrode layer 206.

As described above, in the present embodiment, gate electrode layer 206 is embedded in groove $5a$ forming the stripe pattern as first pattern 5, so that the stripe pattern as first pattern 5 is used as a trench gate structure of a power semiconductor element.

Accordingly, the trench gate structure of the power semiconductor element can be formed with high accuracy while preventing occurrence of a pattern shape failure. Therefore, a higher-performance, higher-quality semiconductor product can be obtained.

Although a MOSFET is described above as a power semiconductor element, other power semiconductor elements such as an IGBT (Insulated Gate bipolar Transistor) may be employed.

(Sixth Embodiment)

The stripe pattern as first pattern 5 formed in main chip region 2 may be used for a stripe contact structure of a power semiconductor element. Such structure is described below with reference to FIG. 16.

Referring to FIG. 16, an interlayer insulating film 210 is formed on the first main surface of semiconductor substrate $1a$ to cover gate electrode layer 206. A contact hole $210a$ reaching the first main surface of semiconductor substrate $1a$ is formed in interlayer insulating film 210. Source electrode 208 is formed on interlayer insulating film 210, and electrically connected to both of $n^+$ source region 204 and a $p^+$ contact region 205 through contact hole $210a$. That is, source electrode 208 is electrically connected to both of $n^+$ source region 204 and $p^+$ contact region 205 through interlayer insulating film 210 and contact hole $210a$, and electrically isolated from gate electrode layer 206.

As described above, in the present embodiment, contact hole $210a$ is regarded as a concave pattern portion (groove) forming the stripe pattern as the first pattern. That is, contact hole $210a$ and a maintained portion of interlayer insulating film 210 adjacent to contact hole 210a (convex pattern portion) form the first pattern. The first pattern is a stripe pattern in which contact holes 210a and the maintained portions of interlayer insulating films 210 adjacent to contact holes 210a are alternately arranged, for example.

Then, an upper conducting portion (source electrode 208) and a lower conducting portion ($n^+$ source region 204 and $p^+$ contact region 205) electrically contact each other through contact hole 210a, so that the stripe pattern as the first pattern (contact hole 210a and the maintained portion of interlayer insulating film 210) is used for a stripe contact structure of a power semiconductor element.

Accordingly, the stripe contact structure of the power semiconductor element can be formed with high accuracy while preventing occurrence of a pattern shape failure. Therefore, a higher-performance, higher-quality semiconductor product can be obtained.

(Seventh Embodiment)

Figure 17A:
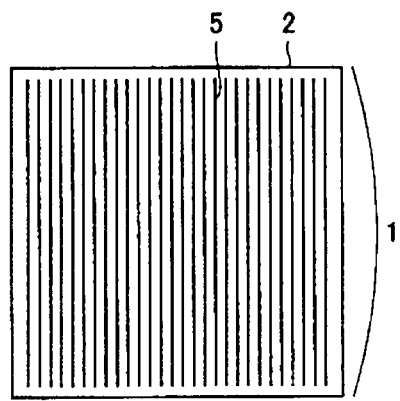
FIG. 17A is a schematic plan view in which the size of one side of the rectangular main chip region is set to 1.
Figure 17B:
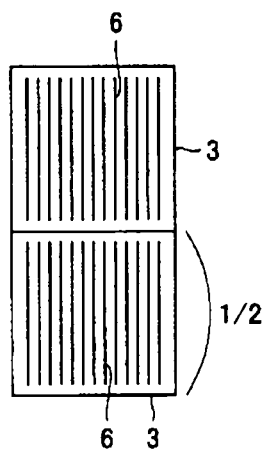
FIG. 17B is a schematic plan view in which the size of one side of the rectangular sub-chip region is set to ½.
Figure 17C:
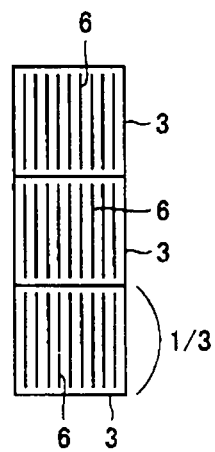
FIG. 17C is a schematic plan view in which the size of one side of the rectangular sub-chip region is set to ⅓.

Although main chip region 2 and sub-chip region 3 are not defined in size in the first embodiment, the size of main chip region 2 is preferably an integral multiple of the size of sub-chip region 3, as shown in FIGS. 17A to 17C. When a size of one side of rectangular main chip region 2 is set to 1 as shown in FIG. 17A, a size of one side of rectangular sub-chip region 3 is preferably set to ½ as shown in FIG. 17B, or ⅓ as shown in FIG. 17C, for example. That is, the size of one side of main chip region 2 shown in FIG. 17A is twice the size of one side of the sub-chip region shown in FIG. 17B, and three times the size of one side of the sub-chip region shown in FIG. 17C.

Consequently, when a pattern is formed with a stepper, shot arrangement is aligned. Thus, main chip region 2 can be cut without cutting sub-chip region 3 during dicing of main chip region 2.

(Additional Comments)

Although the first and second patterns are described as stripe patterns in the first to seventh embodiments, the same effect can be obtained even when the first and second patterns are hole patterns or oblong patterns.

Although the patterns and devices formed on a silicon wafer are described in the first to seventh embodiments, the same effect can be obtained with a silicon carbide wafer which has been developed in recent years and with which high efficiency is expected.

The present invention may be advantageously applied particularly to a semiconductor device having chips arranged in a surface of a semiconductor wafer and a method of manufacturing the same.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A semiconductor device comprising:
a semiconductor wafer having a main surface;
a plurality of first chip regions arranged in matrix form in said main surface;
a plurality of second chip regions arranged adjacent to said plurality of first chip regions in said main surface to surround a periphery of a region where said plurality of first chip regions are arranged; and
a blank region arranged in an outer region on the main surface of the semiconductor wafer so that neither the first chip regions nor the second chip regions reach a circumferential edge of the semiconductor wafer, wherein
said second chip regions are smaller in area than said first chip regions,
each of the plurality of first chip regions has a first pattern,
each of the plurality of second chip regions has a second pattern,
said second pattern is formed in an identical design pattern to said first pattern, and
each of said first chip regions and said second chip regions has a rectangular shape when viewed two-dimensionally.

2. The semiconductor device according to claim 1, wherein each of said first pattern and said second pattern is a stripe pattern in which a plurality of pattern portions run parallel to one another.

3. The semiconductor device according to claim 2, wherein a width of each of said pattern portions of said first pattern is equal to a width of each of said pattern portions of said second pattern, and an interval between said pattern portions adjacent to each other of said first pattern is equal to an interval between said pattern portions adjacent to each other of said second pattern.

4. The semiconductor device according to claim 1, wherein each of said first pattern and said second pattern includes a plurality of grooves, and a plurality of mesa regions, and is a stripe pattern in which said grooves and said mesa regions are alternately arranged.

5. The semiconductor device according to claim 4, wherein each of said mesa regions of said stripe pattern as said first pattern has a width of not more than 1.5 μm.

6. The semiconductor device according to claim 4, wherein each of said grooves of said stripe pattern as said first pattern has an aspect ratio of not less than 6.

7. The semiconductor device according to claim 1, further comprising a power semiconductor element having a gate electrode formed in each of said grooves of said stripe pattern as said first pattern.

8. The semiconductor device according to claim 1, wherein each of said first pattern and said second pattern includes a plurality of contact holes, and
said semiconductor device further comprises
a lower conducting portion positioned under a contact hole of said stripe pattern as said first pattern, and
an upper conducting portion positioned on said contact hole of said stripe pattern as said first pattern, and
said lower conducting portion is connected to said upper conducting portion through said contact hole.

9. The semiconductor device according to claim 1, further comprising a functional element formed in said second chip region.

10. The semiconductor device according to claim 1, wherein a size of a side of said first chip region is an integral multiple of a size of a side of said second chip region.

11. The semiconductor device according to claim 10, wherein the integral multiple is greater than 1.

12. A method of manufacturing a semiconductor device according to claim 1, comprising the steps of:
forming a photosensitive material on a main surface of a semiconductor wafer;
exposing a first chip formation region in which said plurality of first chip regions shall be formed of said photosensitive material to light corresponding to said first pattern;
exposing a second chip formation region in which said plurality of second chip regions shall be formed of said photosensitive material to light corresponding to said second pattern;

developing said photosensitive material having been exposed to lights corresponding to said first and second patterns, to pattern said photosensitive material; and selectively removing a portion to be etched of said semiconductor wafer by etching with patterned said photosensitive material as a mask, to transfer said first pattern to said plurality of first chip regions corresponding to said first chip formation region in said portion to be etched, and transfer said second pattern to said plurality of second chip regions corresponding to said second chip formation region in said portion to be etched.

13. The semiconductor device according to claim 1, wherein the blank region is interposed between the second chip regions and the circumferential edge of the semiconductor wafer.

14. The semiconductor device according to claim 1, wherein the blank region is interposed between all of the plurality second chip regions of the semiconductor wafer and the circumferential edge of the semiconductor wafer.

* * * * *